United States Patent
Uno et al.

(10) Patent No.: US 10,511,144 B2
(45) Date of Patent: Dec. 17, 2019

(54) SEMICONDUCTOR LIGHT-EMITTING DEVICE

(71) Applicant: SHIMADZU CORPORATION, Kyoto-shi, Kyoto (JP)

(72) Inventors: Shingo Uno, Kyoto (JP); Tomoyuki Hiroki, Kyoto (JP); Koji Tojo, Kyoto (JP); Jiro Saikawa, Kyoto (JP); Naoya Ishigaki, Kyoto (JP); Junki Sakamoto, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 16/082,938

(22) PCT Filed: Mar. 9, 2016

(86) PCT No.: PCT/JP2016/057309
§ 371 (c)(1),
(2) Date: Sep. 7, 2018

(87) PCT Pub. No.: WO2017/154128
PCT Pub. Date: Sep. 14, 2017

(65) Prior Publication Data
US 2019/0097395 A1    Mar. 28, 2019

(51) Int. Cl.
*H01S 5/00* (2006.01)
*H01S 5/068* (2006.01)
(Continued)

(52) U.S. Cl.
CPC ........ *H01S 5/06825* (2013.01); *H01S 5/0021* (2013.01); *H01S 5/0264* (2013.01);
(Continued)

(58) Field of Classification Search
CPC ...... H01S 5/4018; H01S 5/0021; H01S 5/062; H01S 5/06808; H01S 5/4025;
(Continued)

(56) References Cited

U.S. PATENT DOCUMENTS 6,137,816 A * 10/2000 Kinbara .............. H01S 5/02248
372/29.012
6,259,714 B1 * 7/2001 Kinbara .................. H01S 5/042
372/38.02

(Continued)

FOREIGN PATENT DOCUMENTS

JP    H06275895    9/1994
JP    H1187818    3/1999
(Continued)

OTHER PUBLICATIONS

"International Preliminary Report on Patentability; this report contains the following items :Form PCT/IB/373, PCT/ISA237(cover sheet), PCT/ISA237(Box No. I),PCT/ISA237(Box No. V),", dated Sep. 11, 2018, which is English translation of "Written Opinion of the International Searching Authority", p. 1-p. 8.

(Continued)

*Primary Examiner* — Kinam Park
(74) *Attorney, Agent, or Firm* — JCIPRNET

(57) ABSTRACT

The present invention comprises: a light-emitting element group configured from columns of serially connected light-emitting elements, one of the ends from each of the columns of the light-emitting elements being collectively connected to a power source; current control elements, provided to correspond to the columns, and being connected to each of the columns of the light-emitting elements at the other end thereof, for controlling the current flowing through the light-emitting elements; a forward voltage monitoring circuit for monitoring, for each of the columns, the total forward voltage across the light-emitting elements; and a (Continued)

control circuit for controlling the current control elements, on the basis of the total forward voltage across the light-emitting elements from each of the columns detected by the forward voltage monitoring circuit, in such a manner that the variations in the total forward voltage across the columns of the light-emitting elements reach a threshold value or lower.

3 Claims, 2 Drawing Sheets

(51) Int. Cl.
*H01S 5/026* (2006.01)
*H01S 5/0683* (2006.01)
*H01S 5/062* (2006.01)
*H01S 5/40* (2006.01)
*H05B 33/08* (2006.01)

(52) U.S. Cl.
CPC ............ *H01S 5/062* (2013.01); *H01S 5/0683* (2013.01); *H01S 5/06808* (2013.01); *H01S 5/06812* (2013.01); *H01S 5/4018* (2013.01); *H01S 5/4025* (2013.01); *H05B 33/0812* (2013.01); *H05B 33/0827* (2013.01); *Y02B 20/46* (2013.01)

(58) Field of Classification Search
CPC ............... H01S 5/06825; H01S 5/0264; H01S 5/06812; H01S 5/0683
See application file for complete search history.

(56) References Cited

U.S. PATENT DOCUMENTS

| | | | |
|---|---|---|---|
| 2007/0274355 A1* | 11/2007 | Hattori | H01S 5/06804 |
| | | | 372/38.02 |
| 2010/0109537 A1* | 5/2010 | Nishino | H05B 33/0827 |
| | | | 315/185 R |
| 2017/0196055 A1* | 7/2017 | Jao | H05B 33/0815 |
| 2018/0317292 A1* | 11/2018 | Katsura | H05B 33/0821 |

FOREIGN PATENT DOCUMENTS

| | | |
|---|---|---|
| JP | 2005129877 | 5/2005 |
| JP | 2007317800 | 12/2007 |
| JP | 2008130523 | 6/2008 |
| JP | 2009123838 | 6/2009 |
| JP | 2013089777 | 5/2013 |

OTHER PUBLICATIONS

"International Search Report (Form PCT/ISA/210) of PCT/JP2016/057309," dated May 24, 2016, with English translation thereof, pp. 1-2.

"Office Action of China Counterpart Application", dated Nov. 4, 2019, with English translation thereof, p. 1-p. 12.

* cited by examiner

SEMICONDUCTOR LIGHT-EMITTING DEVICE

CROSS-REFERENCE TO RELATED APPLICATION

This application is a 371 application of the International PCT application serial no. PCT/JP2016/057309, filed on Mar. 9, 2016. The entirety of the above-mentioned patent application is hereby incorporated by reference herein and made a part of this specification.

BACKGROUND OF THE INVENTION

Technical Field

The present invention relates to a semiconductor light-emitting device which has a light-emitting element module that connects a plurality of serially connected light-emitting elements in parallel, in particular, to a technology which suppresses the heat generation of a transistor that controls currents of the light-emitting elements.

Related Art

In a semiconductor laser device recited in patent literature 1, a plurality of serially connected laser diodes are further connected in a plurality of columns in parallel, anodes of the plurality of columns of laser diodes are collectively connected, and cathodes of the plurality of columns of laser diodes are collectively connected to configure a plurality of parallel lines. In this way, currents can be provided to each laser diode by one current control element. Therefore, the semiconductor laser device can be realized with a simple configuration.

However, potential differences of the plurality of laser diodes on each parallel line are the same, but a forward voltage of each laser diode has individual difference. Therefore, the currents flowing through the plurality of laser diodes on each parallel line are different, so that the currents would concentrate in any one of the parallel lines. As a result, the service life of the laser diodes where the currents concentrate becomes short.

In addition, in a semiconductor laser device recited in patent literature 2, a plurality of serially connected laser diodes (lines) are provided in a plurality of columns, one of the ends from each of the plurality of columns of lines is collectively connected, current control elements are connected to the plurality of columns of lines at the other end, and the current in each line is controlled by each current control element. On this occasion, if the number of the laser diodes on each line is set to be the same, the heat generation of the current control elements becomes great due to a forward voltage difference of the laser diode in each line.

In addition, patent literatures 3, 4 are known as conventional literature.

LITERATURE OF RELATED ART

Patent Literature

Patent Literature 1: Japanese Laid-open No. 2009-123833
Patent Literature 2: Japanese Laid-open No. 2005-129877
Patent Literature 3: Japanese Laid-open No. 11-87818
Patent Literature 4: Japanese Laid-open No. 6-275895

SUMMARY

Problems to be Solved

However, in patent literature 2, there is a problem that if the number of the laser diodes changes for absorbing the forward voltage difference in each line, a total output of the laser diodes would change.

The present invention provides a semiconductor light-emitting device which obtains a desirable light output, suppresses the heat generation of current control elements and extends the service life of light-emitting elements, when a plurality of light-emitting elements are serially connected and connected in parallel.

Means to Solve the Problems

In order to solve the problem above, the semiconductor light-emitting device of the present invention includes: a light-emitting element group configured from a plurality of columns of serially connected light-emitting elements, one of the ends from each of the plurality of columns of the light-emitting elements being collectively connected to a power source; a plurality of current control elements, provided to correspond to the plurality of columns, and being connected to each of the columns of the light-emitting elements at the other end thereof, for controlling the current flowing through the light-emitting elements; a forward voltage monitoring circuit for monitoring, for each of the columns, the total forward voltage across the light-emitting elements; and a control circuit for controlling the current control elements, on the basis of the total forward voltage across the light-emitting elements from each of the columns detected by the forward voltage monitoring circuit, in such a manner that the variations in the total forward voltage across the plurality of columns of the light-emitting elements reach a threshold value or lower.

Effect

According to the present invention, the control circuit controls the current control elements, on the basis of the total forward voltage across the light-emitting elements from each of the columns detected by the forward voltage monitoring circuit, in such a manner that the variations in the total forward voltage across the plurality of columns of the light-emitting elements reach a threshold value or lower, so that a desirable light output is obtained, the heat generation of the current control element can be suppressed, and the service life of the light-emitting element can be extended.

DESCRIPTION OF THE EMBODIMENTS

Embodiment 1

Next, a semiconductor light-emitting device of the embodiment of the present invention is described specifically with reference to drawings.

Figure 1:
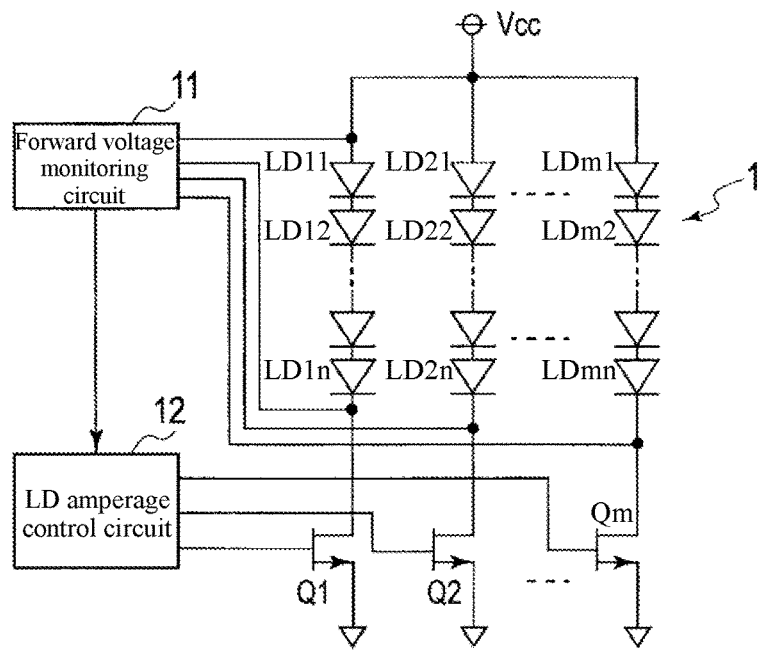
FIG. 1 is a circuit configuration diagram of a semiconductor light-emitting device of embodiment 1 of the present invention.

FIG. 1 is a circuit configuration diagram of a semiconductor light-emitting device of embodiment 1 of the present invention. As shown in FIG. 1, the semiconductor light-emitting device includes: a laser diode group 1, a plurality of current control elements Q1-Qm, a forward voltage monitoring circuit 11, and a LD amperage control circuit 12. The laser diode group 1 corresponds to a light-emitting element group of the present invention and is made from a plurality of light-emitting elements. In the embodiment, laser diodes (LD) are used as the light-emitting elements, however, light-emitting diodes (LED) can also be used as the light-emitting elements.

The laser diode group 1 is configured from n serially connected laser diodes being provided in m columns (LD11-LD1n, LD21-LD2n . . . LDm1-LDmn), and anodes of m columns of n laser diodes LD11-LD1n, LD21-LD2n . . . LDm1-LDmn are collectively connected to a power source Vcc.

The plurality of current control elements Q1-Qm are made from MOSFET, provided corresponding to m in columns of n laser diodes LD11-LD1n, LD21-LD2n, . . . LDm1-LDmn, connected to cathodes of each column of n laser diodes LD11-LD1n, LD21-LD2n . . . LDm1-LDmn, and control currents flowing through each column of n laser diodes LD11-LD1n, LD21-LD2n . . . LDm1-LDmn.

The forward voltage monitoring circuit 11 monitors a total forward voltage of n laser diodes LD11-LD1n, a total forward voltage of n laser diodes LD21-LD2n, . . . , and a total forward voltage of n laser diodes LDm1-LDmn. Here, the forward voltage is a voltage between anode-cathode of the laser diodes LD.

The LD amperage control circuit 12 corresponds to a control circuit of the present invention, and controls the current control elements Q1-Qm, on the basis of the total forward voltage of n laser diodes LD11-LD1n, the total forward voltage of n laser diodes LD21-LD2n, . . . , and the total forward voltage of n laser diodes LDm1-LDmn detected by the forward voltage monitoring circuit 11, in such a manner that variations of the total forward voltage of n laser diodes LD11-LD1n, the total forward voltage of n laser diodes LD21-LD2n, . . . and the total forward voltage of n laser diodes LDm1-LDmn reaches a threshold value or lower. That is, the LD amperage control circuit 12 controls the current control elements Q1-Qm in such a manner that the currents of n laser diodes in columns of which the total forward voltage is great are decreased, or the currents of n laser diodes in columns of which the total forward voltage is small are increased.

Next, the operation of the semiconductor light-emitting device of embodiment 1 which is configured in this way is specifically described with reference to FIG. 1. Here, the m of m columns is set to 3 for example. Furthermore, the m is not limited to 3.

At first, the forward voltage monitoring circuit 11 monitors the total forward voltage Vd1 of n laser diodes LD11-LD1n, the total forward voltage Vd2 of n laser diodes LD21-LD2n, and the total forward voltage Vd3 of n laser diodes LD31-LD3n. Here, for example, the relation is Vd1>Vd2>Vd3.

Next, the LD amperage control circuit 12 controls the current control elements Q1-Q3, on the basis of the total forward voltage Vd1 of n laser diodes LD11-LD1n, the total forward voltage Vd2 of n laser diodes LD21-LD2n, and the total forward voltage Vd3 of n laser diodes LD31-LD3n detected by the forward voltage monitoring circuit 11, in such a manner that the variations of three total forward voltages Vd1, Vd2, Vd3 reach the threshold value or lower.

In this example, the total forward voltage Vd1 is the greatest voltage, so that the LD amperage control circuit 12 decreases the voltage applied to a gate of the current control elements Q1 and decreases the currents flowing through n laser diodes LD11-LD1n. Therefore, the total forward voltage Vd1 of n laser diodes LD11-LD1n is decreased and the total forward voltage Vd1 gets close to the total forward voltage Vd2.

Furthermore, the LD amperage control circuit 12 adjusts the currents flowing through n laser diodes LD11-LD1n, in such a manner that the variations (differential voltage) of the total forward voltage Vd1 and the total forward voltage Vd2 reach the threshold value or lower.

Next, the total forward voltage Vd3 is the smallest voltage, so that the LD amperage control circuit 12 increases the voltage applied to a gate of the current control element Q3 and increases the currents flowing through n laser diodes LD31-LD3n. Therefore, the total forward voltage Vd3 of n laser diodes LD31-LD3n is increased and the total forward voltage Vd3 gets close to the total forward voltage Vd2.

Furthermore, the LD amperage control circuit 12 adjusts the currents flowing through n laser diodes LD31-LD3n, in such a manner that the variations of the total forward voltage Vd3 and the total forward voltage Vd2 reach the threshold value or lower.

In this way, the variations of three total forward voltages Vd1, Vd2, Vd3 reach the threshold value or lower, so that a desirable light output is obtained, and a voltage difference applied between drain-source of the current control elements Q1-Q3 can be reduced. In this way, heat generation variations of the current control elements Q1-Q3 can be suppressed, an excessive current crowding can be avoided by setting a threshold value, and the service life of the laser diodes LD11-LD1n . . . LD31-LD3n can be extended.

In addition, variations of the forward voltage caused by a difference of materials of the laser diodes or a difference of lots can also be suppressed. Furthermore, because the light conversion of the laser diodes having a great forward voltage is inefficient, the light conversion efficiency can be improved by increasing currents flowing through the laser diodes having a small forward voltage.

Embodiment 2

Figure 2:
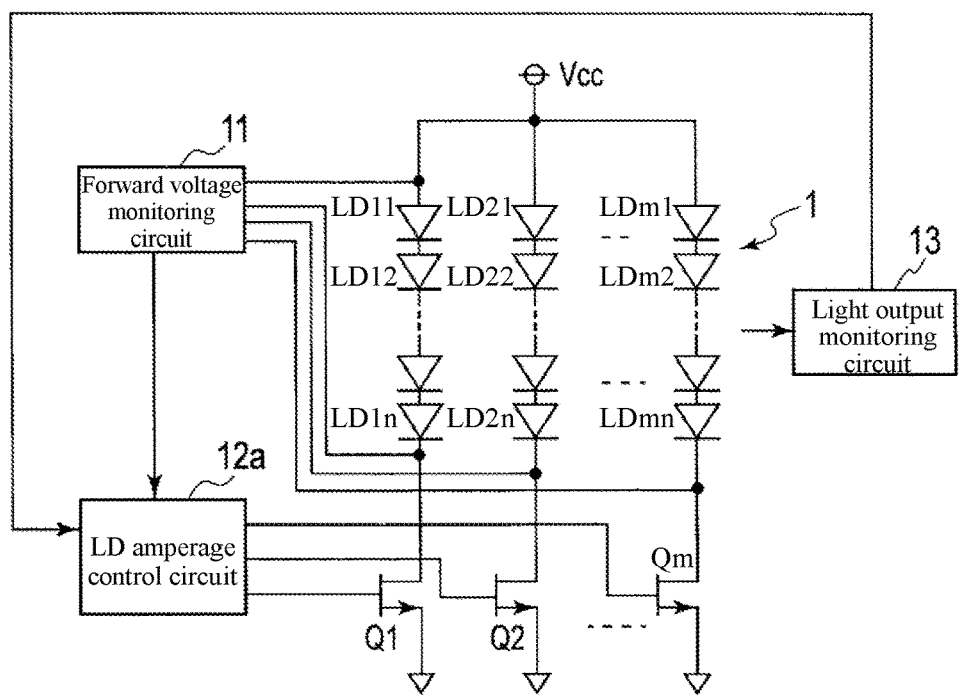
FIG. 2 is a circuit configuration diagram of a semiconductor light-emitting device of embodiment 2 of the present invention.

FIG. 2 is a circuit configuration diagram of a semiconductor light-emitting device of embodiment 2 of the present invention. The semiconductor light-emitting device of embodiment 2 shown in FIG. 2 further includes, in the configuration shown in FIG. 1, a light output monitoring circuit 13 monitoring the light output of the laser diode group 1.

A LD amperage control circuit 12a controls the currents of n laser diodes in such a manner that the light output of the laser diode group 1 from the light output monitoring circuit 13 reaches a prescribed output, and controls the current control elements Q1-Qm in such a manner that the total current flowing through m columns of n laser diodes LD11-LD1n, LD21-LD2n LDm1-LDmn reaches a minimum value.

Next, the operation of the semiconductor light-emitting device of embodiment 2 which is configured in this way is described. Here, the m of m columns is set to 3 for example. Furthermore, the m is not limited to 3.

At first, the light output monitoring circuit 13 monitors the light output of the laser diode group 1. The LD amperage control circuit 12a inputs the light output of the laser diode group 1 from the light output monitoring circuit 13.

The LD amperage control circuit 12a calculates an electric power of each column of the plurality of laser diodes, on the basis of the total forward voltage of each column of the plurality of laser diodes from the forward voltage monitoring circuit 11 and the currents flowing through the plurality of laser diodes.

The electric power of n laser diodes LD11-LD1n is obtained by calculating the total forward voltage Vd1 and the laser diode currents. The electric power of n laser diodes LD21-LD2n is obtained by calculating the total forward voltage Vd2 and the laser diode currents. The electric power of n laser diodes LD31-LD3n is obtained by calculating the total forward voltage Vd3 and the laser diode currents.

The LD amperage control circuit 12a controls the laser diode currents, in such a manner that the light output of the laser diode group 1 from the light output monitoring circuit 13 reaches a prescribed output. The light output of the laser diode group 1 is equivalent to a total electric power of the electric power of n laser diodes LD11-LD1n, the electric power of n laser diodes LD21-LD2n and the electric power of n laser diodes LD31-LD3n. Therefore, the LD amperage control circuit 12a controls the current control elements Q1-Q3 in such a manner that a total light output of three columns of n laser diode reaches a prescribed output.

Next, the LD amperage control circuit 12a controls the current control elements Q1-Q3, in such a manner that the total current flowing through n laser diodes LD11-LD1n, LD21-LD2n, LD31-LD3n reaches a minimum value, in a state when the light output is maintained at the prescribed output.

That is, according to the semiconductor light-emitting device of embodiment 2, by monitoring the light output, a current distribution can be controlled to realize the highest light conversion efficiency in the state when the light output is maintained at the prescribed output.

Embodiment 3

Figure 3:
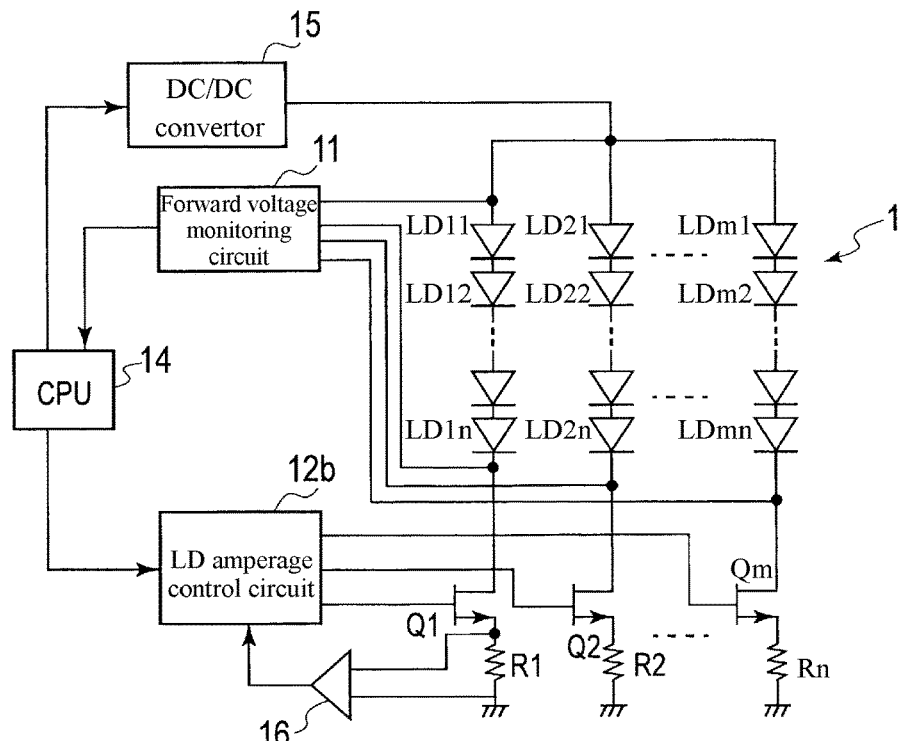
FIG. 3 is a circuit configuration diagram of a semiconductor light-emitting device of embodiment 3 of the present invention.

FIG. 3 is a circuit configuration diagram of a semiconductor light-emitting device of embodiment 3 of the present invention. The semiconductor light-emitting device of embodiment 3 shown in FIG. 3 further includes a CPU 14, a DC/DC convertor 15, resistors R1-Rn, and an amplifier 16 in the configuration of the semiconductor light-emitting device of embodiment 1 shown in FIG. 1.

The resistors R1-Rn are connected to a source of the current control elements Q1-Qn. The amplifier 16 amplifies a voltage corresponding to the current flowing through the resistor R1, and outputs the voltage to the LD amperage control circuit 12b.

The CPU 14 corresponds to the control circuit of the present invention, generates a voltage drop signal for making the heat generation of each current control element Q1-Qm under a prescribed value, on the basis of the total forward voltage of n laser diodes LD11-LD1n, the total forward voltage of n laser diodes LD21-LD2n, . . . , and the total forward voltage of n laser diodes LDm1-LDmn detected by the forward voltage monitoring circuit 11, and outputs the voltage drop signal to the DC/DC convertor 15.

The total forward voltage of n laser diodes LD11-LD1n is set to be, for example, 10 V, the total forward voltage of n laser diodes LD21-LD2n is set to be, for example, 20 V, and the total forward voltage of n laser diodes LD31-LD3n is set to be, for example, 15 V.

The DC/DC convertor 15 outputs an initial voltage. The initial voltage necessarily drives a second line (n laser diodes LD21-LD2n) of which the total forward voltage is highest. Therefore, the initial voltage is set to be 21 V (because FET operates sufficiently when the potential difference is 1 V).

Then, the control in embodiment 1 is performed, and the forward voltage difference of each line is decreased. As a result, the forward voltage difference of line 1 (n laser diode LD11-LD1n) reaches 13 V, the forward voltage difference of line 2 reaches 17 V, and the forward voltage difference of line 3 (n laser diode LD31-LD3n) is still 15 V (a threshold value is set to be 2 V).

Then, a voltage applied to the FET becomes 4 V from 21-17 V. FET operates in 1 V, so that the output of the DC/DC convertor can be decreased to 18 V. As a result, the voltage applied to the FET of each line can be suppressed, and an electric power consumption of the whole device can be reduced.

Furthermore, the CPU 14 outputs the total forward voltage of n laser diodes LD11-LD1n, the total forward voltage of n laser diodes LD21-LD2n, . . . , and the total forward voltage of n laser diodes LDm1-LDmn detected by the forward voltage monitoring circuit 11 to the LD amperage control circuit 12b.

Operation of the LD amperage control circuit 12b is the same as operation of the LD amperage control circuit 12 shown in FIG. 1, so that the description of the operation is omitted here.

Embodiment 4

Figure 4:
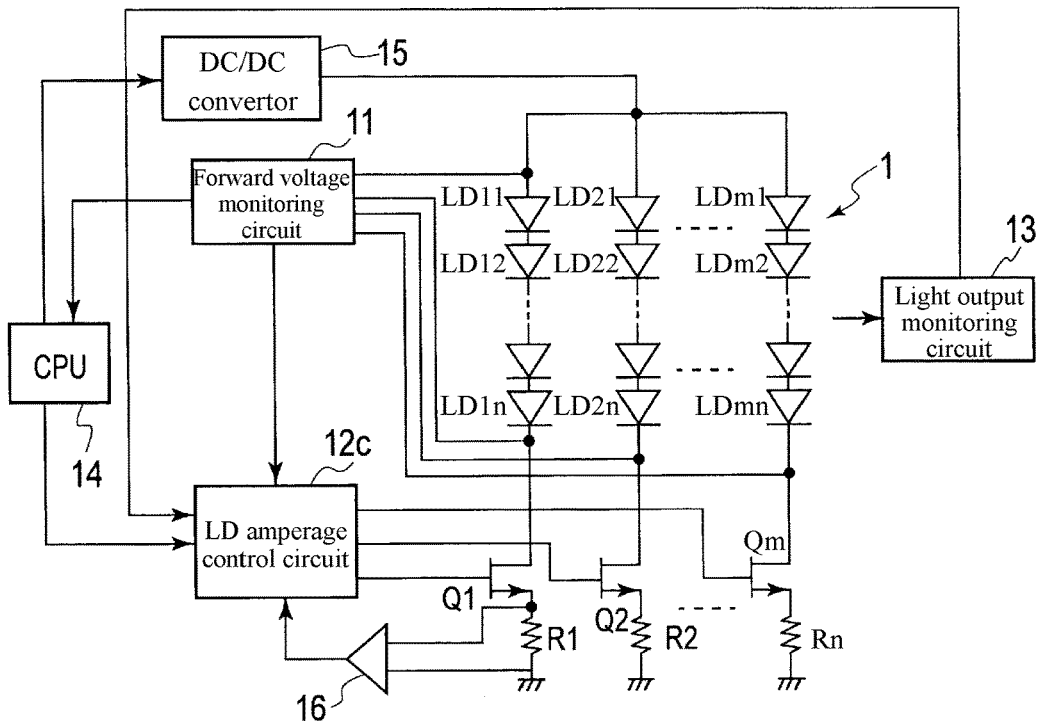
FIG. 4 is a circuit configuration diagram of a semiconductor light-emitting device of embodiment 4 of the present invention.

FIG. 4 is a circuit configuration diagram of a semiconductor light-emitting device of embodiment 4 of the present invention. The semiconductor light-emitting device of embodiment 4 shown in FIG. 4 is characterized by a configuration of a combination of the configuration of the semiconductor light-emitting device of embodiment 2 shown in FIG. 2 and the configuration of the semiconductor light-emitting device of embodiment 3 shown in FIG. 3.

According to the semiconductor light-emitting device of embodiment 4 which is configured in this way, the operation of the semiconductor light-emitting device of embodiment 2 and the operation of the semiconductor light-emitting device of embodiment 3 are performed. Therefore, an effect of the semiconductor light-emitting device of embodiment 2 and an effect of the semiconductor light-emitting device of embodiment 3 are obtained.

INDUSTRIAL APPLICABILITY

The present invention is applicable to a laser-machining device and so on.

What is claimed is:

1. A semiconductor light-emitting device, comprising:
a light-emitting element group, configured from a plurality of columns of serially connected light-emitting elements, one of ends from each of the plurality of columns of the light-emitting elements being collectively connected to a power source;
a plurality of current control elements, provided to correspond to the plurality of columns, and being connected to each of the plurality of columns of the light-emitting elements at the other end thereof, controlling currents flowing through the light-emitting elements;
a forward voltage monitoring circuit, monitoring, for each of the plurality of columns, a total forward voltage across the light-emitting elements; and a control circuit, controlling the plurality of current control elements by outputting a control signal to each of the plurality of current control elements, based on the total forward voltage across the light-emitting elements from each of the plurality of columns detected by the forward voltage monitoring circuit, such that variations in the total forward voltage across the plurality of columns of the light-emitting elements reach a threshold value or lower.

2. The semiconductor light-emitting device according to claim 1, comprising a light output monitoring circuit which monitors a light output of the light-emitting element group, wherein the control circuit controls the currents, such that the light output of the light-emitting element group from the light output monitoring circuit reaches a prescribed output, and controls the plurality of current control elements, such that a total current flowing through the plurality of columns of the light-emitting elements reaches a minimum value.

3. The semiconductor light-emitting device according to claim 1, wherein the control circuit decreases a voltage of the power source which is applied to one of the ends from each of the plurality of columns of the light-emitting elements, based on the total forward voltage across the light-emitting elements from each of the plurality of columns, such that heat generation of the plurality of current control elements is under a prescribed value.

* * * * *